(12) United States Patent
Kang et al.

(10) Patent No.: US 7,541,740 B2
(45) Date of Patent: Jun. 2, 2009

(54) PLASMA DISPLAY DEVICE

(75) Inventors: Tae-Kyoung Kang, Asan-si (KR); Sok-San Kim, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 681 days.

(21) Appl. No.: 11/056,265

(22) Filed: Feb. 14, 2005

(65) Prior Publication Data
US 2005/0184664 A1 Aug. 25, 2005

(30) Foreign Application Priority Data
Feb. 21, 2004 (KR) .................. 10-2004-0011696

(51) Int. Cl.
*H01J 17/49* (2006.01)
(52) U.S. Cl. ....................... 313/582; 345/42
(58) Field of Classification Search .................. 345/37, 345/41, 42, 205, 206, 36, 60; 313/582–587; 315/169.4
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Sinoda et al. | |
| 5,724,054 A | 3/1998 | Shinoda | |
| 5,786,794 A | 7/1998 | Kishi et al. | |
| 5,822,191 A * | 10/1998 | Tagusa et al. | 361/751 |
| 5,952,782 A | 9/1999 | Nanto | |
| RE37,444 E | 11/2001 | Kanazawa | |
| 6,630,916 B1 | 10/2003 | Shinoda | |
| 6,707,436 B2 | 3/2004 | Setoguchi et al. | |
| 2001/0033009 A1 * | 10/2001 | Inoue et al. | 257/668 |

(Continued)

FOREIGN PATENT DOCUMENTS

CN    1217519    5/1999

(Continued)

OTHER PUBLICATIONS

Japanese Office Action corresponding to Japanese Patent Application No. 2005-042919, issued on Jul. 3, 2007.

(Continued)

*Primary Examiner*—Nimeshkumar D. Patel
*Assistant Examiner*—Christopher M Raabe
(74) *Attorney, Agent, or Firm*—Robert E. Bushnell, Esq.

(57) ABSTRACT

A plasma display device prevents interconnect wiring from breaking due to thermal deformation, and is thus suitable for high definition. The plasma display device includes a chassis base, a plasma display panel disposed in front of the chassis base to display an image, a circuit board disposed in back of the chassis base for driving the plasma display panel, and interconnect wiring connecting the circuit board to the plasma display panel. The plasma display device has a structure in which a ratio of a distance between an end of the circuit board and a curve apex of the interconnect wiring to a distance between a front end and a back end of the interconnect wiring is at least 0.25. As a result, the interconnect wiring is prevented from breaking due to thermal expansion of the plasma display panel and the chassis base.

19 Claims, 6 Drawing Sheets

FRONT ←——→ BACK

U.S. PATENT DOCUMENTS

2005/0194913 A1* 9/2005 Kim et al. .............. 315/169.4

FOREIGN PATENT DOCUMENTS

| JP | 02-148645 | | 6/1990 |
|----|-----------|---|--------|
| JP | 2845183 | | 10/1998 |
| JP | 2917279 | | 4/1999 |
| JP | 2000206898 A | * | 7/2000 |
| JP | 2001-13883 | | 1/2001 |
| JP | 2001-043804 | | 2/2001 |
| JP | 2001-308256 | | 11/2001 |
| JP | 2001-325888 | | 11/2001 |
| JP | 2002-14625 | | 1/2002 |
| JP | 2003-115568 | | 4/2003 |
| JP | 2003-216054 | | 7/2003 |
| KR | 10-2001-0098816 | | 11/2001 |

OTHER PUBLICATIONS

Korean Office Action of the Korean Patent Application No. 2004-11696 issued on May 26, 2006.

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

Registration Determination Certificate from the Chinese Patent Office issued in Applicant's corresponding Chinese Patent Application No. ZL 200510054180.2 dated Feb. 11, 2009.

* cited by examiner

FRONT ←——→ BACK

PLASMA DISPLAY DEVICE

CLAIM OF PRIORITY

This application makes reference to, incorporates the same herein, and claims all benefits accruing under 35 U.S.C. §119 from an application entitled PLASMA DISPLAY DEVICE filed with the Korean Intellectual Property Office on Feb. 21, 2004, and there duly assigned Serial No. 10-2004-0011696.

BACKGROUND OF THE INVENTION

1. Technical Field

The present invention relates to a plasma display device and, more particularly, to a plasma display device having an improved structure that prevents interconnect wiring which transmits a driving signal from breaking.

2. Description of the Related Art

Plasma display devices are flat display devices which displays images using gas discharge, and have excellent performance in terms of display capacity, brightness, contrast, after-image, viewing angle, etc. In addition, plasma display devices can be made slim and large and thereby have been touted as the next generation of flat display devices.

A plasma display device includes a plasma display panel (PDP) which acts as an image display unit. The plasma display device also includes a chassis base which is combined with the PDP. Discharge occurring in the PDP and chassis base generates heat during operation of the plasma display device, and this can cause thermal deformation. Since the PDP and the chassis base have different degrees of thermal expansion, bending deformation can occur, and this bending deformation can cause breaking of interconnect wiring connected to the PDP and extending to circuit boards which provide power to the PDP, and to other electrical elements necessary for high definition and high resolution performance of the plasma display device.

Therefore, there is a need for a solution to the problem of breaking of the interconnect wiring in a plasma display device.

SUMMARY OF THE INVENTION

The present invention provides a plasma display device having an improved structure that prevents interconnect wiring from breaking due to thermal deformation.

The present invention also provides a plasma display device suitable for high definition.

According to an aspect of the present invention, a plasma display device includes a chassis base, a plasma display panel disposed in front of the chassis base for displaying an image, a circuit board disposed in back of the chassis base for driving the plasma display panel, and interconnect wiring connecting the circuit board with the plasma display panel. The plasma display device has a structure wherein a ratio of the distance between an end of the circuit board and a curve apex of the interconnect wiring to the distance between a front end and a back end of the interconnect wiring is at least 0.25 so as to prevent the interconnect wiring from breaking due to thermal expansion of the plasma display panel and the chassis base. The ratio may be limited to a maximum of 1.15.

According to another aspect of the present invention, a plasma display device includes a chassis base, a plasma display panel disposed in front of the chassis base for displaying an image, a circuit board disposed in back of the chassis base for driving the plasma display panel, and interconnect wiring connecting the circuit board with the plasma display panel. The plasma display device has a structure wherein a ratio of the distance between an end of the plasma display panel and a curve apex of the interconnect wiring to the distance between a front end and a back end of the interconnect wiring is at least 0.25 so as to prevent the interconnect wiring from breaking due to thermal expansion of the plasma display panel and the chassis base. The ratio may be limited to a maximum of 1.15.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
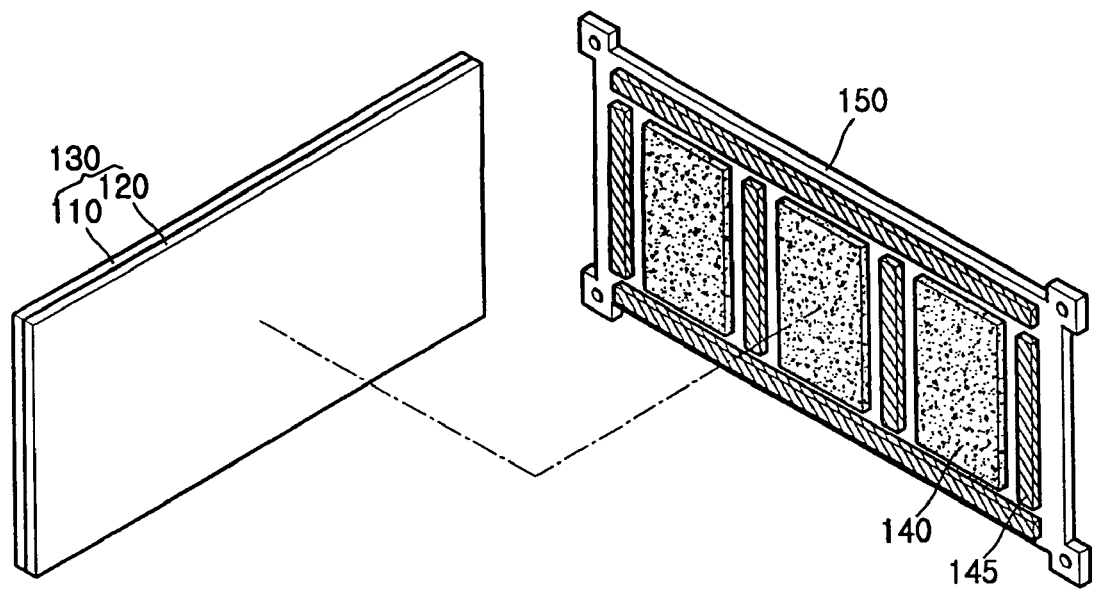
FIG. 1 illustrates a state in which a plasma display panel (PDP) and a chassis base are joined.

Hereinafter, exemplary embodiments of the present invention will be described with reference to the attached drawing, wherein like reference numerals refer to the like elements throughout.

Figure 2:
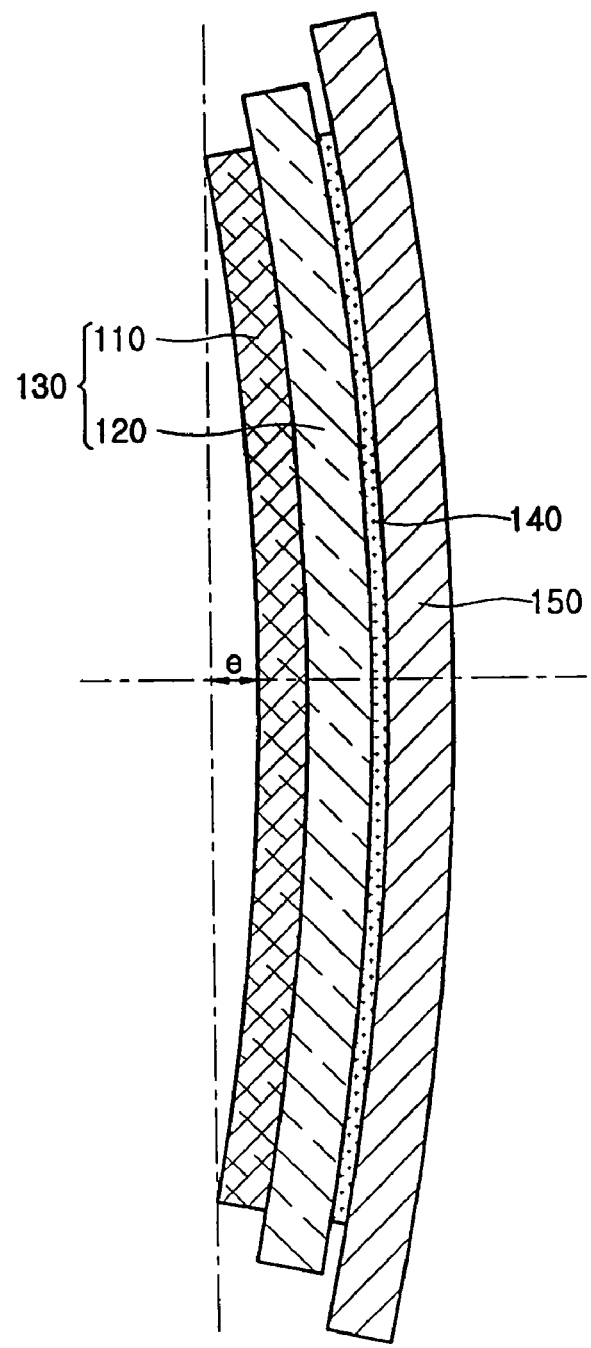
FIG. 2 is a sectional view showing bending deformation of the PDP and the chassis base.

FIG. 1 illustrates a state in which a plasma display panel (PDP) and a chassis base are joined, and FIG. 2 is a sectional view showing bending deformation of the PDP and the chassis base.

Referring to FIG. 1, a PDP 130 includes a first panel 110 and a second panel 120 which are joined facing each other. The PDP 130 is combined with a chassis base 150 such that a double-sided tape 145 and a heat transfer sheet 140 are interposed between the PDP 130 and the chassis base 150. The chassis base 150 is made of an aluminum material having excellent heat conductivity so as to serve as a heat dissipation plate for the PDP 130.

In the PDP 130 and the chassis base 150, discharge is performed, and thermal deformation occurs due to heat generated during the discharge operation. The PDP 130 is formed of a glass material having a thermal expansion coefficient of about 8.5 $\mu m/m°$ C., and the chassis base 150 is formed of an aluminum material having a thermal expansion coefficient of about 23.8 $\mu m/m°$ C. Therefore, the PDP 130 and the chassis base 150 have different degrees of thermal expansion. As a result, bending deformation occurs, as shown in FIG. 2.

For example, when the PDP 130 and the chassis base 150 are joined to each other at room temperature (e.g., 25° C.), and thereafter the temperature increases to 80° C. during operation, the PDP 130 is bent backward to a bending deformation degree "e" of about 4 mm.

A plurality of circuit boards (not shown) provide a driving signal and electric power to the PDP 130. The circuit boards are installed on the back of the chassis base 150, and interconnect wiring (not shown) is connected to an electrode of the PDP 130 and extends to the circuit boards. The interconnect wiring may be implemented as a flexible printed circuit (FPC), which may break due to thermal deformation as described above. In particular, to provide a high-definition and high-resolution plasma display device, many electrical elements and interconnect wiring connected to the electrical elements must be installed. Accordingly, a solution to interconnect wiring breakage is increasingly desired.

Figure 3:
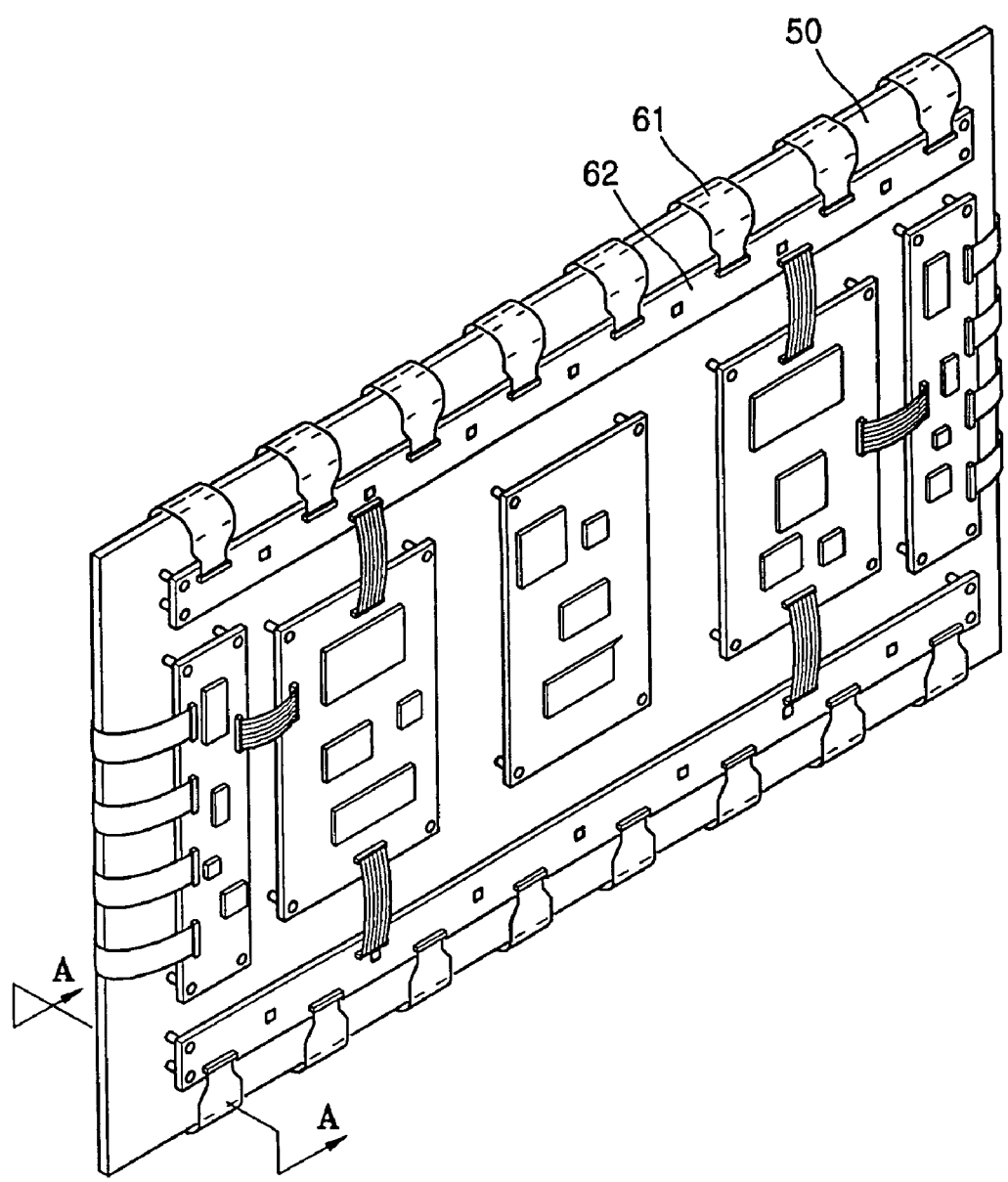
FIG. 3 is a perspective view of a plasma display device according to an embodiment of the present invention.
Figure 4:
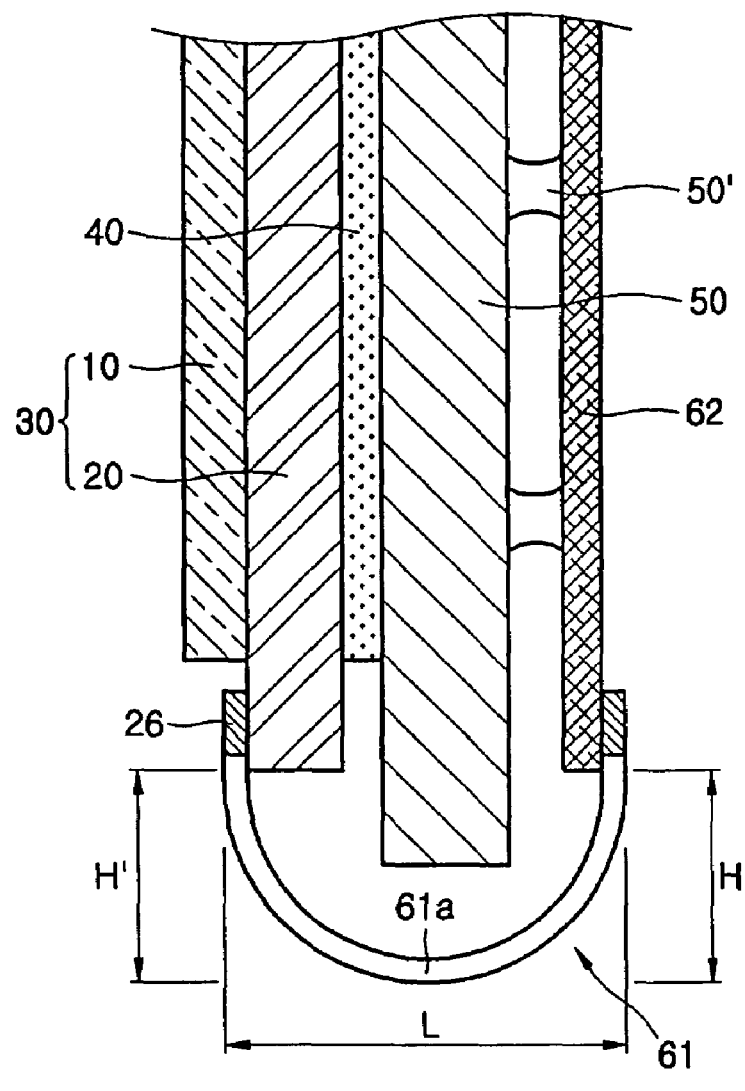
FIG. 4 is a sectional view of the plasma display device taken along the line A-A of FIG. 3.
Figure 5:
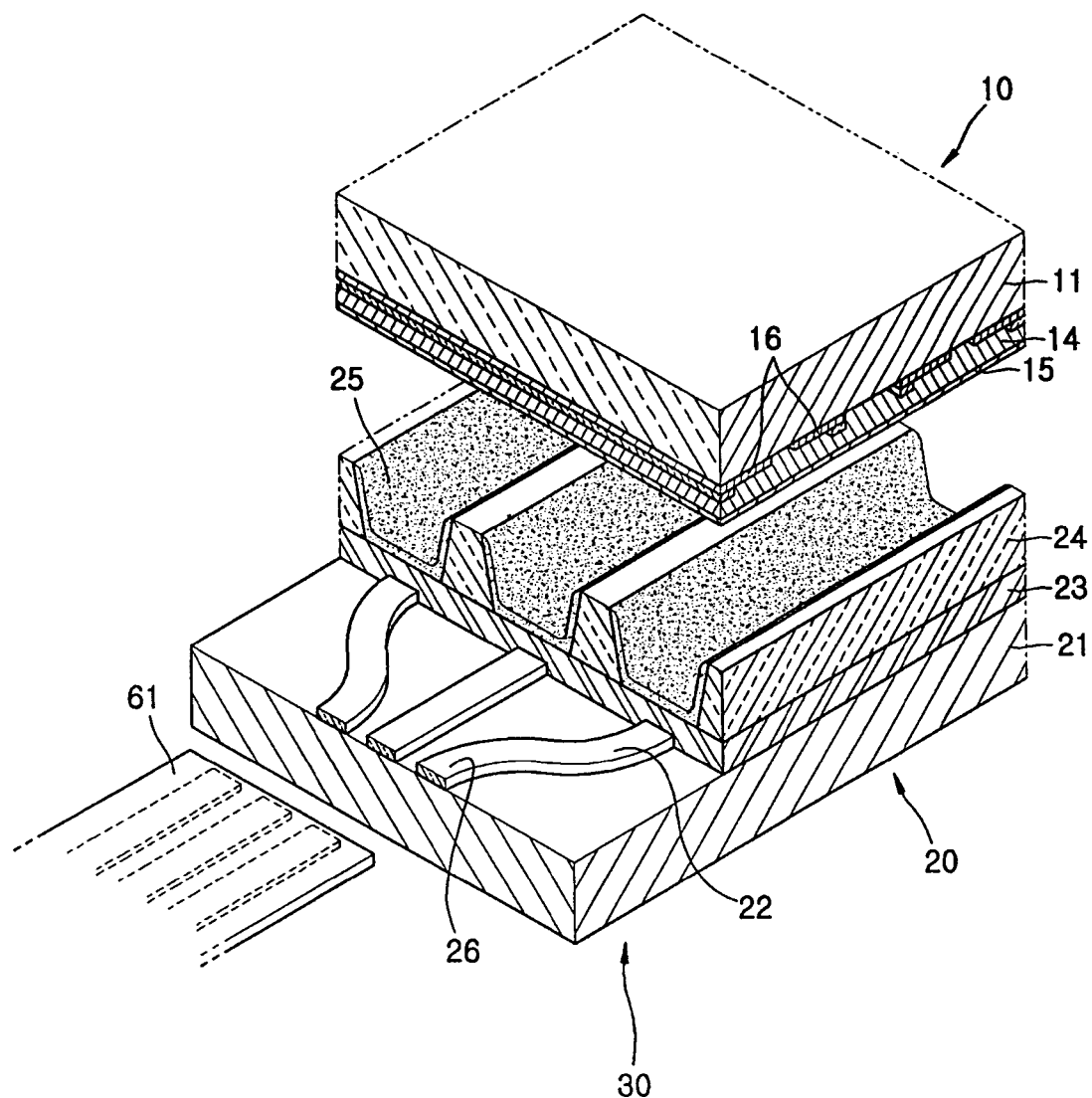
FIG. 5 is an exploded perspective view of the plasma display device shown in FIG. 4.

FIG. 3 is a perspective view of a plasma display device according to an embodiment of the present invention, FIG. 4 is a sectional view of the plasma display device taken along the line A-A of FIG. 3, and FIG. 5 is an exploded perspective view of the plasma display device shown in FIG. 4.

Referring to FIGS. 3 and 4, a plasma display device includes a plasma display panel (PDP) 30, a chassis base 50 disposed facing the PDP 30, and a heat transfer sheet 40 interposed between the PDP 30 and the chassis base 50. Referring to FIG. 5, the PDP 30 includes a first panel 10 and a second panel 20 which are disposed one above the other so as to face each other. The first panel 10 includes a first substrate 11, a discharge sustain electrode pair 16 disposed on a bottom surface of the first substrate 11, a first dielectric layer 14 covering the discharge sustain electrode pair 16, and a protective layer 15.

The first substrate 11 is formed of glass and has a different composition and different thermal characteristics according to the manufacturer. For example, in a temperature range of room temperature through 300° C., Soda-Lime and PD200 made by Japanese Asahi Glass have thermal expansion coefficients of 8.4 µm/m° C. and 8.5 µm/m° C., respectively, and NPX-7 made by NSG & Pilkington has a thermal expansion coefficient of 8.71 µm/m° C.

A plurality of discharge sustain electrode pairs 16 disposed on the bottom surface of the first substrate 11 may be arranged in a predetermined pattern, for example, a striped pattern. The discharge sustain electrode pairs 16 are covered by the first dielectric layer 14. Preferably, the first dielectric layer 14 is covered by the protective layer 15.

The second panel 20 includes a second substrate 21, address electrodes 22 disposed on a top surface of the second substrate 21, a second dielectric layer 23 covering the address electrodes 22, a barrier 24 disposed on the second dielectric layer 23, and a fluorescent layer 25. Similar to the first substrate 11, the second substrate 21 may be made of glass.

The address electrodes 22 are disposed on the second substrate 21 in a predetermined pattern, e.g., a striped pattern. The address electrodes 22 are covered by the second dielectric layer 23. Barriers 24 may be arranged on the second dielectric layer 23 so as to be parallel to the address electrodes 22. The barriers 24 define a plurality of discharge cells in which discharge is performed. The fluorescent layer 25 is deposited on the second dielectric layer 23 and sidewalls of the adjacent barriers 24.

The address electrodes 22 are electrically connected to interconnect wiring 61 through their connection parts 26 such that a predetermined driving signal is applied to each of the address electrodes 22. A control signal is applied to each address electrode 22 so as to selectively provoke discharge in the discharge cells. As a result, diverse colors can be expressed according to grayscales.

Referring back to FIG. 4, the chassis base 50 functions as a heat dissipation plate for the PDP 30. In order to carry out this function, the chassis base 50 is formed of a material (e.g., aluminum) having excellent heat conductivity.

A circuit board 62 carrying or provided with a plurality of circuit elements (not shown) is installed on the chassis base 50. For the installation of the circuit board 62, a boss 50' maybe formed on the back surface of the chassis base 50. A driving signal generated in the circuit board 62 is applied to the PDP 30 via the interconnect wiring 61 extending from the back to the front of the plasma display device. The interconnect wiring 61 may be implemented as a flexible printed circuit (FPC), which is formed by sequentially stacking an adhesive layer, a patterned copper foil, and a solder resist (SR) layer on a base film made of a resin such as polyimide. A driving integrated circuit or IC (not shown) for converting a driving signal may be installed on the FPC.

The plasma display device having the above-described structure is characterized by a ratio (hereinafter, referred to as a height-to-length (H/L) ratio) of the distance H between an end of the circuit board 62 and a curve apex 61a of the interconnect wiring 61 to the distance L between the frontmost end and the rearmost end of the interconnect wiring 61. In the latter regard, the distance L may have a predetermined value equal to the sum of the thicknesses of the second substrate 21 (FIG. 5), the heat transfer sheet 40, the chassis base 50, the boss 50', and the circuit board 62, e.g., 20 mm.

Figure 6:
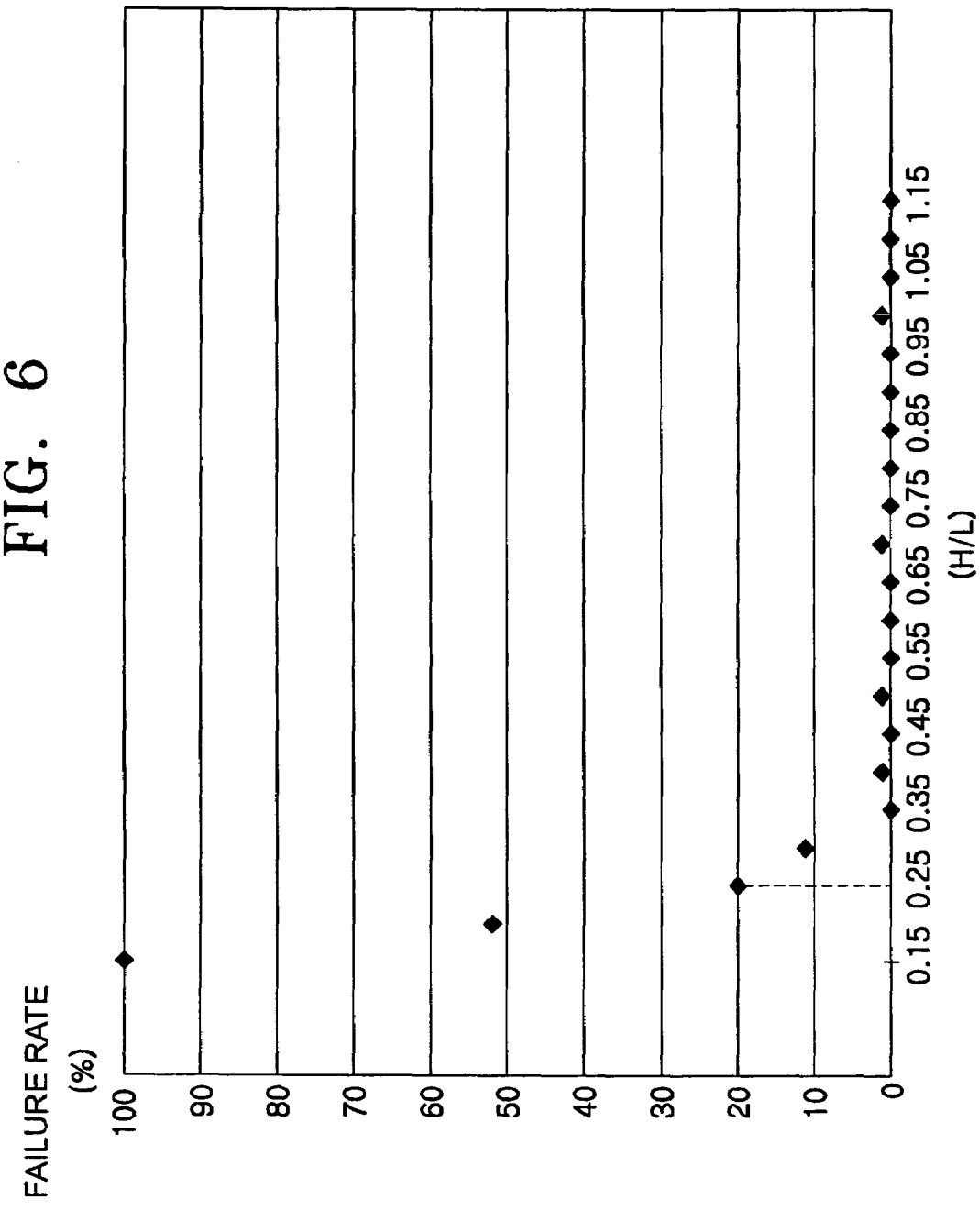
FIG. 6 is a graph illustrating a profile of failure rate according to the design variable of interconnect wiring.

FIG. 6 illustrates a profile of the failure rate of the interconnect wiring 61 according to the H/L ratio. The failure rate was obtained from a hundred interconnect wiring products having a fixed distance L (e.g., 20 mm) in an experiment in which the number of interconnect wirings 61 broken due to thermal deformation during operation was measured and the measured number was converted into a percentage.

Referring to FIG. 6, with an increase in the H/L ratio, the failure rate decreases rapidly. In detail, when the H/L ratio is 0.15, the failure rate is 100%, that is, all of the interconnect wirings 61 are broken due to thermal deformation. As the H/L ratio increases from 0.15, the failure rate decreases rapidly. Thus, when the H/L ratio is 0.25, the failure rate decreases to 20%. When the H/L ratio is 0.35, the failure rate decreases to 0%, and there is no breakage of interconnect wiring due to thermal deformation.

It can be inferred from the results of the experiment that, when the H/L does not exceed 0.15, the interconnect wiring 61 does not flexibly change with respect to thermal deformation during operation, and therefore, the interconnect wiring 61 is broken due to stress. When the H/L is at least 0.25, some marginal length of the interconnect wiring 61 is secured, and therefore, the interconnect wiring 61 can flexibly change with respect to thermal deformation. When the H/L is at least 0.35, the interconnect wiring 61, breaking due to thermal deformation is prevented.

Meanwhile, when the H/L ratio exceeds 1.15, resistance of the interconnect wiring 61 increases from 90Ω to 120 Ω or more due to an increase in the length of the interconnect wiring 61. Thus, the resistance of the interconnect wiring 61 increases about 33%. As is well known, when the resistance of interconnect wiring increases, an excessive load is applied to a circuit element, and a drive timing error which delays a driving signal may occur. Accordingly, it is preferable that the H/L ratio not exceed 1.15.

Referring back to FIG. 4, when considering thermal deformation, a design variable of the interconnect wiring 61 may be determined to be the H/L ratio, that is, a ratio of the distance H between an end of the PDP 30 and the curve apex 61a to the distance L. When the H/L ratio is used, the same design standard as used when the H/L ratio is used can be used based on the result of the experiment described with reference to FIG. 6.

In the embodiments of the present invention, the interconnect wiring 61 connected to the address electrodes 22 has been described, but the present invention is not restricted thereto. For example, the features of the present invention can also be applied to interconnect wiring connected to the discharge sustain electrode pair 16.

The present invention provides a design standard for interconnect wiring which transmits a driving signal. According to the design standard, the interconnect wiring is prevented from breaking despite thermal deformation of the PDP and the chassis base.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A plasma display device, comprising:
   a chassis base;
   a plasma display panel disposed in front of the chassis base for displaying an image;
   a circuit board disposed in back of the chassis base for driving the plasma display panel; and
   interconnect wiring connecting the circuit board to the plasma display panel;
   wherein the plasma display device has such a structure that a ratio of a distance H between an end of the circuit board and a curve apex of the interconnect wiring to a distance L between a front end and a back end of the interconnect wiring is at least 0.25; and
   wherein the distance L comprises a sum of thicknesses of the plasma display panel, the chassis base, and the circuit board.

2. The plasma display device of claim 1, wherein the ratio is no greater than 1.15.

3. The plasma display device of claim 2, wherein the ratio is at least 0.35.

4. The plasma display device of claim 1, wherein the ratio is at least 0.35.

5. The plasma display device of claim 1, wherein the plasma display panel has a thermal expansion coefficient which is different from a thermal expansion coefficient of the chassis base.

6. The plasma display device of claim 5, wherein the plasma display panel is formed of glass having a thermal expansion coefficient in a range of 8.4 μm/m° C. through 8.71 μm/m° C., and the chassis base is formed of aluminum having a thermal expansion coefficient of 23.8 μm/m° C.

7. A plasma display device, comprising:
   a chassis base;
   a plasma display panel disposed in front of the chassis base for displaying an image;
   a circuit board disposed in back of the chassis base for driving the plasma display panel; and
   interconnect wiring connecting the circuit board to the plasma display panel;
   wherein the plasma display device has such a structure that a ratio of a distance H between an end of the plasma display panel and a curve apex of the interconnect wiring to a distance L between a front end and a back end of the interconnect wiring is at least 0.25; and
   wherein the distance L comprises a sum of thicknesses of the plasma display panel, the chassis base, and the circuit board.

8. The plasma display device of claim 7, wherein the ratio is no greater than 1.15.

9. The plasma display device of claim 8, wherein the ratio is at least 0.35.

10. The plasma display device of claim 7, wherein the ratio is at least 0.35.

11. The plasma display device of claim 7, wherein the plasma display panel has a thermal expansion coefficient which is different from a thermal expansion coefficient of the chassis base.

12. The plasma display device of claim 11, wherein the plasma display panel is formed of glass having a thermal expansion coefficient in a range of 8.4 μm/m° C. through 8.71 μm/m° C, and the chassis base is formed of aluminum having a thermal expansion coefficient of 23.8 μm/m° C.

13. A plasma display device, comprising:
   a chassis base;
   a plasma display panel disposed on one side of the chassis base for displaying an image;
   at least one electrical element disposed on another side of the chassis base; and
   interconnect means for connecting said at least one electrical element to the plasma display panel;
   wherein a ratio of a distance H between an end of said at least one electrical element and a curve apex of the interconnect means to a distance L between a front end and a back end of said interconnect means is at least 0.25; and
   wherein the plasma display panel comprises a substrate, said at least one electrical element comprises a circuit board, and the plasma display device comprises a heat transfer sheet disposed between the plasma display panel and the chassis base, and a boss disposed on a back of the chassis base for installing the circuit board, and wherein the distance L comprises a sum of thicknesses of the substrate, the heat transfer sheet, the chassis base, the boss, and the circuit board.

14. The plasma display device of claim 13, wherein the ratio is no greater than 1.15.

15. The plasma display device of claim 14, wherein the ratio is at least 0.35.

16. The plasma display device of claim 13, wherein the ratio is at least 0.35.

17. The plasma display device of claim 13, wherein the plasma display panel has a thermal expansion coefficient different from a thermal expansion coefficient of the chassis base.

18. The plasma display device of claim 13, wherein the plasma display panel is formed of glass having a thermal expansion coefficient in a range of 8.4 μm/m° C. through 8.71 μm/m° C., and the chassis base is formed of aluminum having a thermal expansion coefficient of 23.8 μm/m° C.

19. The plasma display device of claim 13, wherein said interconnect means comprises a flexible printed circuit.

* * * * *